US010748788B2

(12) United States Patent
Schwab et al.

(10) Patent No.: US 10,748,788 B2
(45) Date of Patent: Aug. 18, 2020

(54) SYSTEM AND METHOD FOR MONITORING TREATMENT OF MICROELECTRONIC SUBSTRATES WITH FLUID SPRAYS SUCH AS CRYOGENIC FLUID SPRAYS (71) Applicant: TEL FSI, INC., Chaska, MN (US)

(72) Inventors: Brent D. Schwab, Burnsville, MN (US); Chimaobi W. Mbanaso, Chaska, MN (US); Gregory P. Thomes, Chaska, MN (US); Kevin Rolf, Victoria, MN (US); Jeffrey M. Lauerhaas, Waconia, MN (US)

(73) Assignee: TEL FSI, INC., Chaska, MN (US)

( * ) Notice: Subject to any disclaimer, the term of this patent is extended or adjusted under 35 U.S.C. 154(b) by 129 days.

(21) Appl. No.: 15/922,203

(22) Filed: Mar. 15, 2018

(65) Prior Publication Data
US 2018/0269080 A1    Sep. 20, 2018

Related U.S. Application Data (60) Provisional application No. 62/473,159, filed on Mar. 17, 2017.

(51) Int. Cl.
H01L 21/67      (2006.01)
H01L 21/687     (2006.01)
H01L 21/02      (2006.01)

(52) U.S. Cl.
CPC .. H01L 21/67051 (2013.01); H01L 21/02041 (2013.01); H01L 21/02076 (2013.01); H01L 21/67109 (2013.01); H01L 21/67253 (2013.01); H01L 21/68714 (2013.01); H01L 21/68764 (2013.01)

(58) Field of Classification Search
CPC ............... H01L 21/67253; H01L 21/67051
See application file for complete search history.

(56) References Cited

U.S. PATENT DOCUMENTS 4,627,197 A    12/1986 Klee et al.
5,062,898 A    11/1991 McDermott et al.
(Continued)

OTHER PUBLICATIONS

PCT International Search Report, International Application No. PCT/US2018/022634, dated May 24, 2018, 4 pages.

Primary Examiner — Mikhail Kornakov
Assistant Examiner — Natasha N Campbell
(74) Attorney, Agent, or Firm — Kagan Binder, PLLC (57) ABSTRACT A system and method for treating a substrate is described. In particular, the system and method for treating a substrate include techniques for removing particles from the surface of a microelectronic substrate. The system includes: a vacuum process chamber; a substrate stage for supporting a microelectronic substrate within the vacuum process chamber; a cryogenic fluid supply system that can provide a fluid or fluid mixture through one or more nozzles arranged within the vacuum process chamber to inject a fluid spray into the process chamber in a direction towards an upper surface of the microelectronic substrate; and a process monitoring system coupled to the vacuum process chamber, and arranged to collect fluid spray data corresponding to at least one measured attribute of the injected fluid spray downstream of an exit of the one or more nozzles.

19 Claims, 7 Drawing Sheets

(56) References Cited

U.S. PATENT DOCUMENTS

| | | | |
|---|---|---|---|
| 5,613,509 A * | 3/1997 | Kolb | B24C 1/003 134/1 |
| 5,813,237 A * | 9/1998 | Grace | A23L 3/362 62/374 |
| 5,961,732 A | 10/1999 | Partin et al. | |
| 6,251,195 B1 * | 6/2001 | Wagener | H01L 21/67028 134/15 |
| 2002/0190203 A1 | 12/2002 | Valaskovic et al. | |
| 2006/0174720 A1 | 8/2006 | Renken et al. | |
| 2007/0017635 A1 * | 1/2007 | Lee | H01L 21/67253 156/345.15 |
| 2011/0286738 A1 * | 11/2011 | Noda | H01L 21/6715 396/611 |
| 2014/0367483 A1 * | 12/2014 | Jackson | B05B 12/082 239/11 |

\* cited by examiner

Increasing Ar flow rate at 100 SLM, 120 SLM, and 140 SLM
at constant LN2 temperature

Fig. 6

Increasing Ar flow rate at 160 SLM, 170 SLM, and 180SLM
at increasing LN2 temperature

```
                                               500
                                              /
            ┌─────────────────────────────────────────┐
            │ Locating a microelectronic substrate on a substrate │── 510
            │       stage in a vacuum process chamber        │
            └─────────────────────────────────────────┘
                              │
            ┌─────────────────────────────────────────┐
            │   Providing a fluid mixture from a cryogenic fluid  │
            │    supply system through one or more nozzles    │── 520
            │  arranged within the vacuum process chamber to   │
            │    inject an aerosol in a direction towards an upper │
            │       surface of the microelectronic substrate      │
            └─────────────────────────────────────────┘
                              │
            ┌─────────────────────────────────────────┐
            │  Monitoring a process for treating the microelectronic │
            │  substrate during the providing by collecting aerosol  │── 530
            │    data corresponding to at least one measured     │
            │   attribute of the aerosol downstream of an exit of the │
            │                one or more nozzles                │
            └─────────────────────────────────────────┘
```

Fig. 9

SYSTEM AND METHOD FOR MONITORING TREATMENT OF MICROELECTRONIC SUBSTRATES WITH FLUID SPRAYS SUCH AS CRYOGENIC FLUID SPRAYS

PRIORITY

This application claims priority to U.S. Provisional Application No. 62/473,159, filed Mar. 17, 2017, entitled "System and Method for Monitoring Treatment of Substrates with Cryogenic Fluid Mixtures", the entire disclosure of which is incorporated herein by reference for all purposes.

FIELD OF INVENTION

This disclosure relates to an apparatus and method for treating the surface of a microelectronic substrate, and in particular for removing objects from the microelectronic substrate using fluid sprays such as cryogenic fluid sprays, wherein a process monitoring system measures characteristic(s) of the fluid sprays and then adjust one or more process parameters in response to the measurement(s).

BACKGROUND OF THE INVENTION

Advances in microelectronic technology have caused integrated circuits (ICs) to be formed on microelectronic substrates (e.g., semiconductor substrates) with ever increasing density of active components. IC manufacturing may be carried out by the application and selective removal of various materials on the microelectronic substrate. One aspect of the manufacturing process may include exposing the surface of the microelectronic substrate to cleaning treatments to remove process residue and/or debris (e.g., particles) from the microelectronic substrate. Various dry and wet cleaning techniques have been developed to clean microelectronic substrates.

However, the advances of microelectronic IC manufacturing have led to smaller device features on the substrate. The smaller device features have made the devices more susceptible to damage and yield loss from smaller particles than in the past. Hence, any techniques that enable the removal of smaller particles, and/or relatively larger particles, without damaging the substrate would be desirable.

SUMMARY

Techniques herein pertain to apparatus embodiments and methods for treating the surface of a microelectronic substrate, and in particular for removing objects from the microelectronic substrate using fluid treatment sprays such as cryogenic fluid sprays. The apparatus embodiments and methods described herein further include techniques for monitoring and/or controlling treatment processes for removing particles from surfaces of a microelectronic substrate. The techniques allow monitoring characteristics of a fluid spray and using the resultant information of the spray itself to adjust process parameters in real time in order to help maintain the operating characteristics of the spray. Directly monitoring the fluid spray itself can allow much more rapid detection and response to changes in spray characteristics as compared to monitoring other conditions (e.g., properties of the fluid or fluid mixtures supplied to a nozzle prior to spraying and/or characteristics of process chamber conditions) that correlate to the spray, since those correlations may involve a lag time from the time a shift in the spray occurs relative to changes in the other conditions. In some embodiments, characteristics of both the fluid spray itself as well as other conditions that correlate to spray conditions may be monitored in a control system.

Described herein are several apparatus embodiments and methods that may use a variety of different fluids or fluid mixtures to provide fluid sprays that remove objects (e.g., particles) from microelectronic substrates. In particular, the microelectronic substrate may be exposed to a fluid spray formed from a pressurized and cooled fluid or fluid mixture in a manner that may allow the spray to remove particles from a surface of the microelectronic substrate. The fluid sprays may include, but are not limited to, cryogenic aerosols and/or gas cluster jet (GCJ) sprays that may be formed by the expansion of the fluid or fluid mixture from a high pressure environment (e.g., greater than atmospheric pressure) to a lower pressure environment (e.g., sub-atmospheric pressure) of the process chamber that may include the microelectronic substrate. According to one embodiment, a system for treating a substrate is described. In particular, the system and method for treating a substrate include techniques for removing particles from the surface of a microelectronic substrate. The system includes: a vacuum process chamber; a substrate stage for supporting a microelectronic substrate within the vacuum process chamber; a cryogenic fluid supply system that can provide a pressurized and cooled fluid or fluid mixture through one or more nozzles arranged within the vacuum process chamber to inject fluid spray in a direction towards an upper surface of the microelectronic substrate; and a process monitoring system coupled to the vacuum process chamber, and arranged to collect fluid spray data for at least one measured attribute of the injected fluid spray downstream of an exit of the one or more nozzles.

According to another embodiment, a method for treating a substrate is described. The method includes: locating a microelectronic substrate on a substrate stage in a vacuum process chamber; providing a fluid or fluid mixture from a cryogenic fluid supply system to one or more nozzles arranged within the vacuum process chamber, using the fluid or fluid mixture and the one or more nozzles to inject a fluid spray into the process chamber in a direction towards an upper surface of the microelectronic substrate; and monitoring a process for treating the microelectronic substrate during the providing by collecting fluid spray data for at least one measured attribute of the fluid spray downstream of an exit of the one or more nozzles.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Methods for selectively removing objects from a microelectronic substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the disclosure. Similarly, for purposes of explanation, specific numbers, materials, and configurations are set forth to provide a thorough understanding of the systems and method. Nevertheless, the systems and methods may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic substrate" as used herein generically refers to the object being processed in accordance with the invention. The microelectronic substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation. In addition to microelectronic substrates, the techniques described herein may also be used to clean reticle substrates that may be used to patterning of microelectronic substrates using photolithography techniques.

Cryogenic fluid cleaning is a technique used to dislodge contaminants by imparting sufficient energy from gas, liquid, or solid particles in a fluid spray, e.g., aerosol particles or gas jet particles (e.g., gas clusters), to overcome the adhesive forces between the contaminants and the microelectronic substrate. Hence, producing or expanding cryogenic fluid or fluid mixtures (e.g., aerosols spray and/or gas cluster jet spray) to form a spray comprising particles of the right size and velocity may be desirable. The momentum of the particles or clusters is a function of mass and the velocity. The momentum may be increased by increasing velocity or mass, which may be important to overcome the strong adhesive forces between the particle and the surface of the substrate especially when the particle may be very small (<100 nm). Aerosol embodiments of fluid sprays can include colloidal suspension of particles dispersed in a gas. The particles may include atomic or molecular clusters, solid-phase particles, or liquid-phase droplets.

In order to influence the velocity of a fluid spray, a carrier gas, comprised of atoms/molecules of relatively smaller or larger atomic weight, can be incorporated into the resultant fluid mixture to enhance the cleaning of the contaminants on the substrate. The carrier gas may or may not be cryogenically cooled with the remainder of fluid mixture. The carrier gas will supply a partial pressure in addition to the partial pressure of the primary cryogen fluid or fluid mixture. Use of a carrier gas helps to increase the velocity of the resultant fluid spray. This technique satisfies a growing need in the semiconductor industry to enhance cleaning of substrates with small contaminates that traditional aerosol techniques are limited due to insufficient kinetic energy.

Figure 1:
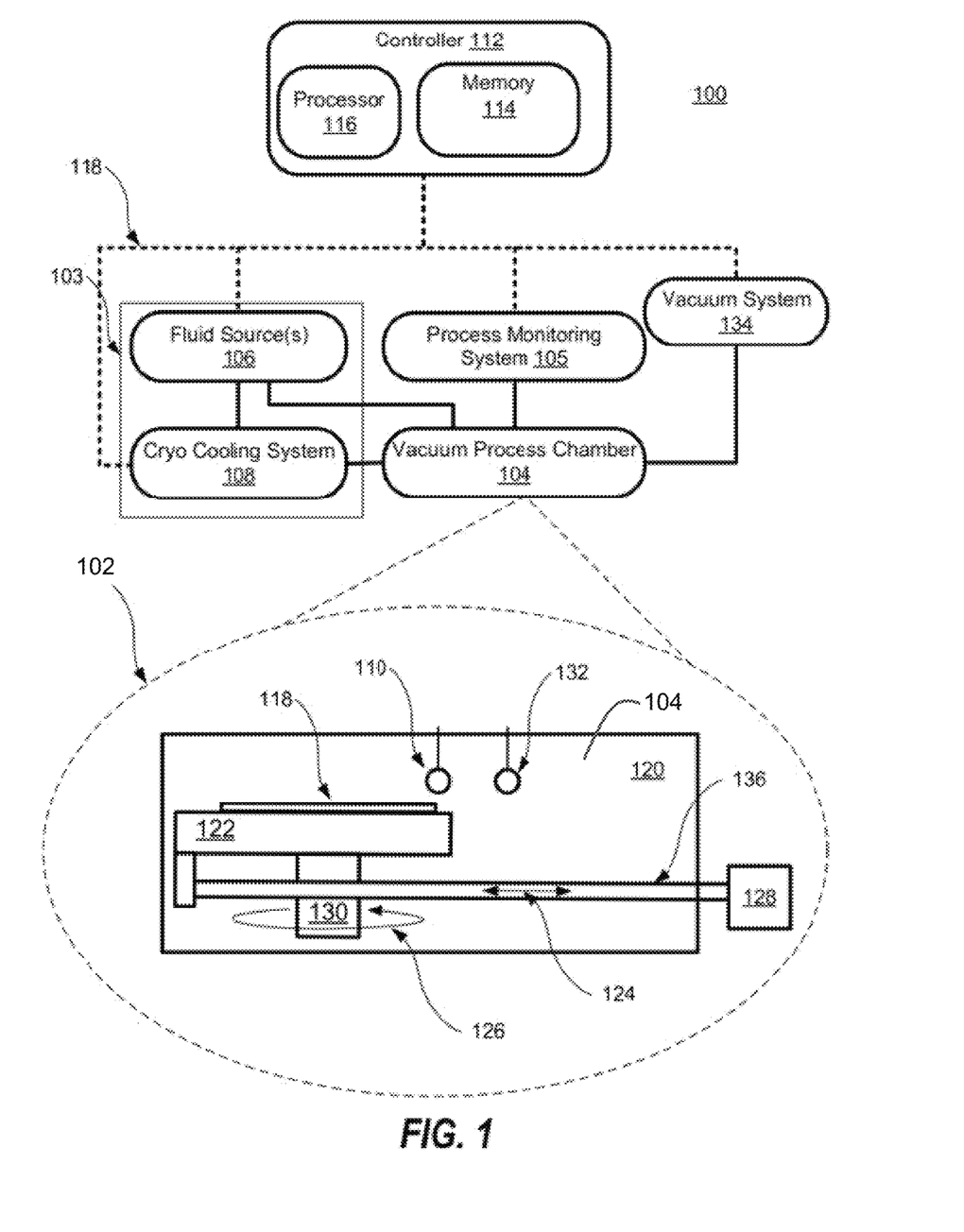
FIG. 1 includes a schematic illustration of a treatment system and a cross-section illustration of a vacuum process chamber of the treatment system according to at least one embodiment.
Figure 2:
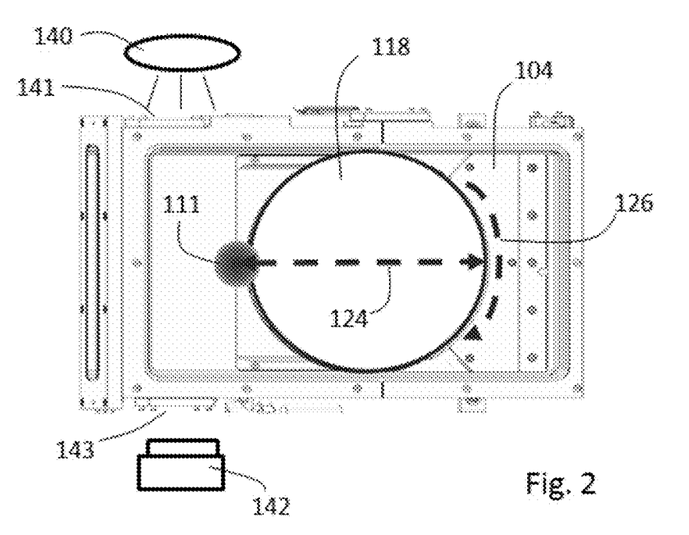
FIG. 2 provides a top view of a treatment system with a process monitoring system according to an embodiment that uses imaging techniques to monitor a fluid spray.

FIGS. 1 and 2 include schematic illustrations of a cleaning system 100 that may be used to clean microelectronic substrates using fluid sprays such as aerosol sprays or gas cluster jet (GCJ) sprays. FIG. 1 includes a cross section illustration 102 of a vacuum process chamber 104 where the cleaning takes place. The fluid spray 111 (see FIG. 2), such as an aerosol spray or GCJ spray, may be formed by expanding cryogenically pressurized and cooled fluid or fluid mixtures from a cryogenic fluid supply system 103 into a sub-atmospheric environment in the vacuum process chamber 104. As shown in FIG. 1, fluid source(s) 106 may provide pressurized fluid(s) to a cryogenic cooling system 108 prior to being expanded through a nozzle 110 in the vacuum process chamber 104. A vacuum system 134 may be used to maintain the sub-atmospheric environment in the vacuum process chamber 104, and to remove the fluid spray as needed.

According to various embodiments, one or more of the following variables may be important to removing objects from the microelectronic substrate: pressures and temperatures of the incoming fluid or fluid mixture supplied to the nozzle 110 prior to expansion into the process chamber 104, the flow rate of the fluid or fluid mixture to the nozzle 110, the composition and ratio of components in the fluid mixture if a mixture is used, the pressure in the vacuum process chamber 104, to name a few. Accordingly, a controller 112 may be used to store the process recipes in memory 114 and may use a computer processor 116 to issue instructions over a network 118 that controls various components of the cleaning system 100 to implement the cleaning techniques disclosed herein.

A person of ordinary skill in the art of semiconductor processing may be able to configure the fluid source(s) 106, cryogenic cooling system 108, the vacuum system 134 and their respective sub-components (not shown, e.g., sensors, controls, etc.) to implement the embodiments described herein. For example, in one embodiment, the treatment system 100 includes components that may be configured to provide pressurized fluid or fluid mixtures to the nozzle 110 at a pressure between 50 psig and 800 psig. The temperature of the fluid or fluid mixture supplied to the nozzle 110 may be maintained at less than 273 K, or in the range of 70 K and 270 K, but preferably between 70 K and 150 K, by passing the fluid or fluid mixture through a liquid nitrogen ("LN2") dewar of the cryogenic cooling system 108. Hence, adjusting the temperature of the LN2 can be used to adjust the temperature of the supplied fluid or fluid mixture. As described further below, the temperature or the pressure of the incoming fluid or fluid mixture can be adjusted in order to help control the phase of the material supplied to nozzle 110. The vacuum system 134 may be configure to maintain the vacuum process chamber 104 at a pressure that may be less than 35 Torr, or more preferably less than 10 Torr, to enhance the formation of fluid sprays of gas, liquid, or solid particles, e.g., aerosols and/or gas clusters, when the pressurized and cooled material is sprayed into the process chamber 104.

The pressurized and cooled fluid mixture may be expanded into the vacuum process chamber 104 through the nozzle 110 that may direct the fluid spray, e.g., an aerosol spray or GCJ spray, towards the microelectronic substrate 118. At least one nozzle 110 may be supported within the process chamber 104, with the nozzle 110 having at least one nozzle orifice that directs the fluid spray towards the microelectronic substrate 118. For example, in one embodiment, the nozzle 110 may be a nozzle spray bar that has a plurality of openings along the length of the nozzle spray. The nozzle 110 may be adjustable so that the angle of the fluid spray impinging on the microelectronic substrate 118 can be optimized for a particular treatment. The microelectronic substrate 118 may be secured to a substrate stage 122 that provides at least one translational degree of freedom 124, preferably along the longitudinal axis of the vacuum process chamber 120, to facilitate linear scanning at least a portion of microelectronic substrate 128 through the fluid spray emanating from the nozzle 110.

The substrate stage 122 may be coupled to the substrate translational drive system 128 that may include one or more slides and guiding mechanisms to define the path of movement of the substrate stage 122, and an actuating mechanism may be utilized to impart the movement to the substrate stage 122 along its guide path. The actuating mechanism may comprise any electrical, mechanical, electromechanical, hydraulic, or pneumatic device. The actuating mechanism may be designed to provide a range of motion sufficient in length to permit movement of the exposed surface of the microelectronic substrate 118 at least partly through the area of fluid spray emanating from the at least one nozzle 110. The substrate translational drive system 128 may include a support arm (not shown) arranged to extend through a sliding vacuum seal (not shown) in a wall of vacuum process chamber 120, wherein a first distal end is mounted to the substrate stage 122 and a second distal end is engaged with an actuator mechanism located outside the vacuum process chamber 120.

Furthermore, the substrate stage 122 may also include a substrate rotational drive system 130 that may provide at least one rotational degree of freedom 126, preferably about an axis normal to the exposed surface of the microelectronic substrate 118, to facilitate rotational indexing of the microelectronic substrate 118 from a first pre-determined indexed position to a second pre-determined indexed position that exposes another portion of the microelectronic substrate 118 to the fluid spray. In other embodiments, the substrate stage 122 may rotate at a continuous speed without stopping at any indexed position. Additionally, the substrate stage 122 may vary the angle of incidence with the fluid spray by changing the position of the microelectronic substrate 118, in conjunction with varying the angle of the nozzle 110, or just by itself.

In another embodiment, the substrate stage 122 may include a mechanism for securing the microelectronic substrate 118 to an upper surface of the substrate stage 122 during impingement of the at least one fluid spray on the exposed surface of the microelectronic substrate 118. The microelectronic substrate 118 may be affixed to the substrate stage 122 using mechanical fasteners or clamps, vacuum clamping, or electrostatic clamping, for example as might be practiced by a person of ordinary skill in the art of semiconductor processing.

Furthermore, the substrate stage 122 may include a temperature control mechanism to control a temperature of the microelectronic substrate 118 at a temperature elevated above or depressed below ambient temperature. The temperature control mechanism can include a heating system (not shown) or a cooling system (not shown) that is configured to adjust and/or control the temperature of substrate stage 122 and microelectronic substrate 118. The heating system or cooling system may comprise a re-circulating flow of heat transfer fluid that receives heat from substrate stage 122 and transfers heat to a heat exchanger system (not shown) when cooling, or transfers heat from the heat exchanger system to substrate stage 122 when heating. In other embodiments, heating/cooling elements, such as resistive heating elements, or thermo-electric heaters/coolers can be included in the substrate stage 122.

As shown best in FIG. 1, the vacuum process chamber 102 may include a dual nozzle configuration (e.g., chamber 102 is configured with both first nozzle 110 and second nozzle 132) that may enable the processing of the substrate 118 using a fluid spray such as a cryogenic aerosol and/or a GCJ spray or a combination thereof within the same vacuum process chamber 120. However, the dual nozzle configuration is not required. Although the nozzles 110,132 are shown to be positioned in a parallel manner they are not required to be parallel to each other to implement the cleaning processes. In other embodiments, the nozzles 110,132 may be at opposite ends of the vacuum process chamber 120 and the substrate stage 122 may move the substrate 118 into a position that enables one or more of the nozzles 110,132 to spray a fluid mixture onto the microelectronic substrate 118.

In another embodiments, the microelectronic substrate 118 may be moved such that the exposed surface area (e.g., area that include the electronic devices) of the microelectronic substrate 118 may be impinged by the fluid spray (e.g., aerosol or GCJ spray) provided from the first nozzle 110 and/or the second nozzle 132 at the same or similar time (e.g., parallel processing) or at different times (e.g., sequential processing). For example, the cleaning process may include an aerosol cleaning process followed by a GCJ cleaning processes or vice versa. Further, the first nozzle 110 and the second nozzle 132 may be positioned so their respective fluid sprays impinge the microelectronic substrate 118 at different locations at the same time. In one instance, the substrate 118 may be rotated to expose the entire microelectronic substrate 118 to the different fluid sprays.

The nozzle 110 may be configured to receive low temperature (e.g., <273K) fluid or fluid mixtures with inlet pressures (e.g., 50 psig-800 psig) substantially higher than the chamber pressures (e.g., <35 Torr). The interior design of the nozzle 110 may enable the expansion of the fluid mixture to generate gas, solid and/or liquid particles that may be directed towards the microelectronic substrate 118. The nozzle 110 dimensions may have a strong impact on the characteristics of the expanded fluid or fluid mixture and range in configuration from simple orifice(s) arranged along a spray bar, multi-expansion volume configurations, to single expansion volume configurations.

The treatment system 100 includes a process monitoring system 105 coupled to the vacuum process chamber 104, and arranged to collect fluid spray data (e.g., aerosol data) for at least one measured attribute of the fluid spray 111 downstream of an exit of the one or more nozzles 110 and 132. The intent is to enhance the performance of the cryogenic aerosol process by directly monitoring the fluid spray 111 to maintain consistent on wafer performance as an alternative to or in combination with other system conditions. Current monitoring of a fluid spray in conventional tools might only measure parameters of fluid material entering a nozzle before spray formation (e.g., gas flow, pressure, and temperature, for example) or process parameters such as process chamber pressure or the like instead of assessing features of the spray 111 itself. As an option, process monitoring system 105 additionally may also monitor other process parameters that do not involve a direct evaluation of the fluid spray 111 itself (e.g., (e.g., supply flow, supply pressure, chamber pressure, supply temperature, and chamber temperature), at least one attribute of the aerosol downstream of the at least one nozzles 110, is measured.

According to an embodiment, the process monitoring system 105 is configured to capture at least one optical image and/or video images of the fluid spray 111, and to use the captured optical information to measure at least one attribute of the fluid spray 111. Examples of fluid spray attributes include spray density is depicted in optical image information, temperature as detected by a temperature sensor 150 in thermal contact with the spray 111, pressure as detected by a pressure sensor 152 in operational engagement with the spray 111, and the like. The optical image can include a shadowgraph or schlieren photograph of the fluid spray. The process monitoring system 105 can be configured to capture a temporal sequence of optical images, and using the temporal sequence of optical images, measure a temporal variation of the at least one attribute of the fluid spray.

For example, the embodiment of system 100 shown in FIGS. 1 and 2 includes a process monitoring system 105 that uses imaging techniques to directly observe and capture images or video of the fluid spray 111 and then to use such image information to assess properties of the fluid spray 111 in real time. The process monitoring system 105 includes a light source 140 arranged to illuminate the fluid spray through chamber window 141, and an optical detector 142 arranged to receive light scattered by the fluid spray 111 during illumination through window 143 and capture one or more optical images of the illuminated fluid spray 111 by observing the fluid spray 111. For example, the process monitoring system 105 is capable of illuminating the fluid spray with white light illumination from light source 140 and then observing the illuminated spray 111 with optical detector 142 by capturing at least one image of the illuminated spray with a digital camera (e.g., a charge-coupled device (CCD) camera, or a charge-injection device (CID) camera). The ability to capture the images and videos of the fluid spray 111 provides a path to monitor and quantify the fluid spray properties and attributes in real time during wafer processing.

Figure 3:
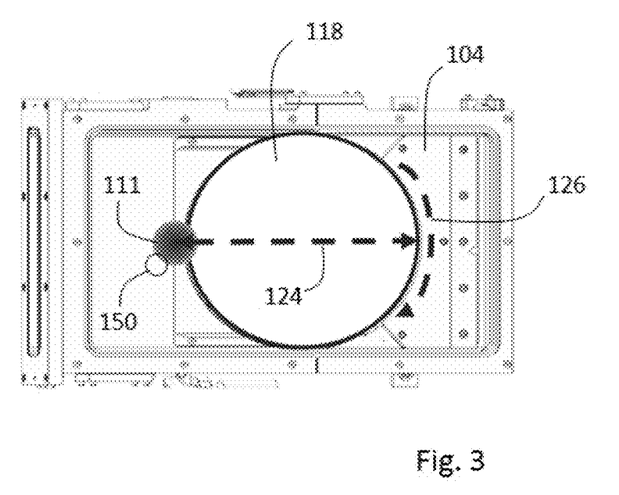
FIG. 3 provides a top view of a treatment system with a process monitoring system according to an embodiment that uses temperature of a fluid spray.

FIG. 3 shows an alternative embodiment of system 100 that is identical to system 100 as depicted in FIG. 2 except that process monitoring system 105 comprises a temperature sensor 150 operationally deployed to measure the temperature of fluid spray 111.

Figure 4:
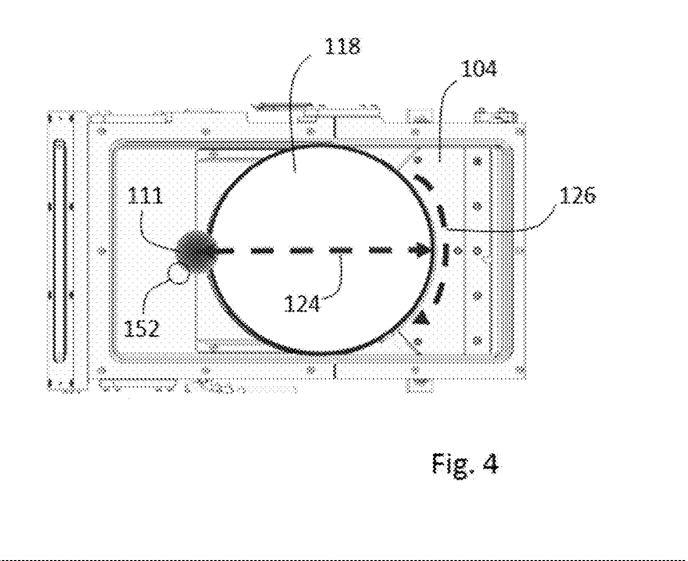
FIG. 4 provides a top view of a treatment system with a process monitoring system according to an embodiment that uses pressure of a fluid spray.

FIG. 4 shows an alternative embodiment of system 100 that is identical to system 100 as depicted in FIG. 2 except that process monitoring system 105 comprises a pressure sensor 150 operationally deployed to measure the pressure of fluid spray 111.

Figure 5:
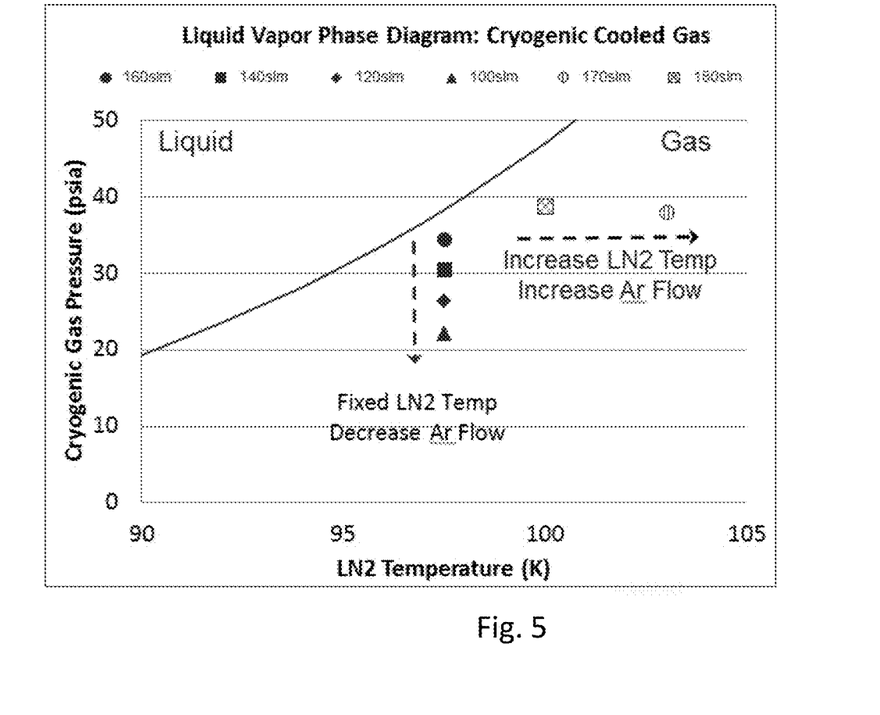
FIG. 5 provides an exemplary liquid-vapor phase diagram for a cryogenically cooled fluid in the form of argon.

FIG. 5 shows how temperature and pressure of the fluid or fluid mixtures supplied to the nozzle 110 of FIGS. 1 to 4 can impact whether the supplied fluid or fluid mixture is in a gas phase, liquid phase, or combination thereof. For purposes of illustration, FIG. 5 shows phase information with respect to pressurized and cooled Argon supplied to nozzle 110. FIG. 5 plots the phase of Argon as a function of argon pressure and liquid nitrogen (LN2) temperature. Because the temperature of the argon cooled by the LN2 correlates to the LN2 temperature, the plot in FIG. 5 shows how the argon phase depends on argon pressure and temperature.

The solid curved line in FIG. 5 is the liquid/gas phase boundary. If a coordinate pair of pressure and temperature is above the line, then the argon is present as a liquid. If a coordinate pair of pressure and temperature is below the line, the argon is present as a gas. If a coordinate pair of pressure and temperature is on the line, then both phases may be present.

FIG. 5 also shows what happens to the argon phase as the argon flow rate is lowered from 160 standard liters per minute (slm) to 100 slm at a constant LN2 temperature. Generally, the argon pressure tends to decrease as the flow rate is lowered. Hence, FIG. 5 shows what happens as the pressure of supplied argon gas at 160 slm with an LN2 temperature of about 97 K is lowered. As the pressure is lowered at a constant LN2 temperature, the argon state moves downward further away from the phase boundary. Hence, lowering the argon pressure at a constant LN2 temperature provides a way to help ensure that the argon is in a gas phase.

FIG. 5 also shows how to keep the argon in a gas phase if the flow rate, and hence pressure, of the argon is increased to 170 slm, 180 slm, or higher. FIG. 5 shows in the first instance that increasing the flow rate from 160 slm to 170 slm at about 97 K creates a risk that the argon may be partially or wholly present in a liquid phase. If a liquid phase is desired, this indicates that increasing the argon pressure at constant temperature provides a way to shift the supplied argon from a gas phase to a liquid phase. On the other hand, if a higher flow rate of gas phase argon is desired, then FIG. 5 shows that increasing the LN2 temperature helps to shift the higher pressure argon more into the gas phase region, helping to prevent formation of a liquid phase.

Figure 6:
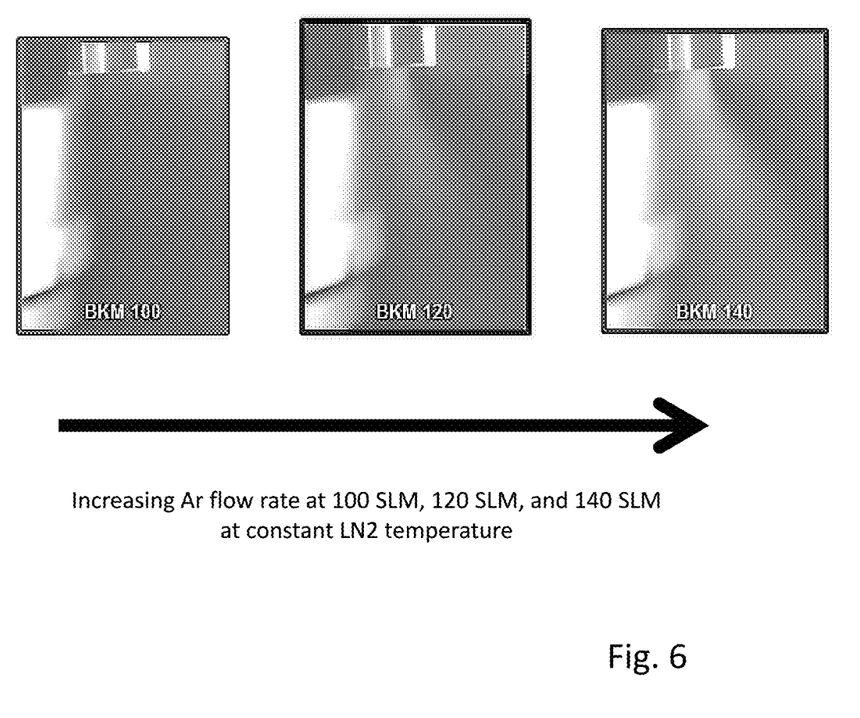
FIG. 6 includes a sequence of fluid spray images to show how changing the flow rate, and hence pressure, of fluid material used to form a fluid spray impacts fluid spray density.
Figure 7:
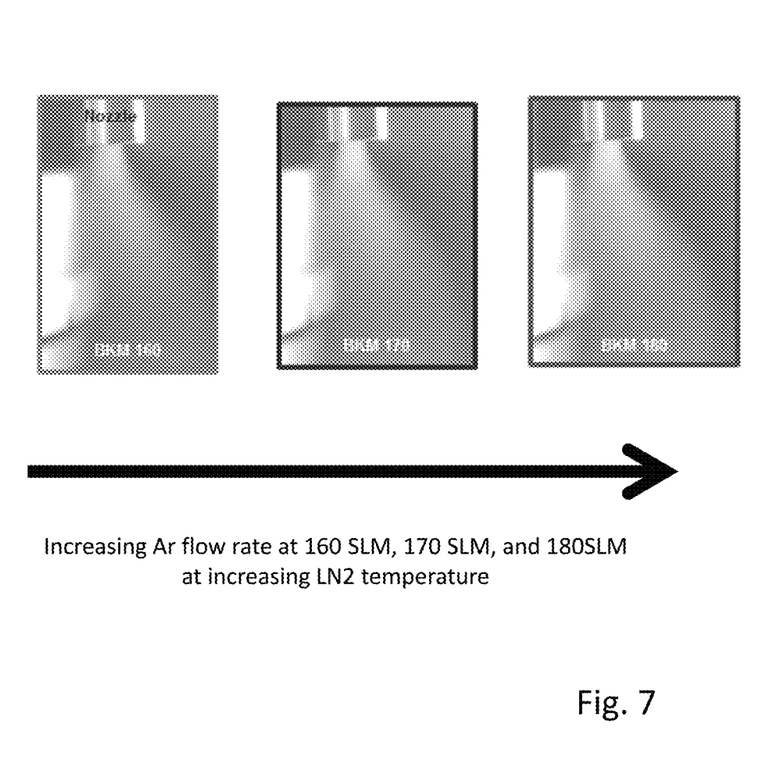
FIG. 7 includes a sequence of fluid spray images to show how changing the temperature of a fluid material to form a fluid spray can maintain fluid spray density at a desired level when the flow rate, and hence pressure, of the fluid material is changed as viewed by the unaided human eye.

FIGS. 6 and 7 show how the temperature and pressure of the incoming fluid material supplied to nozzle 110 impacts the density of the fluid spray 111 dispensed from the nozzle 110. Because the maintaining a fluid spray 111 with a uniform or otherwise controlled density can influence the performance, uniformity, and consistency of treatments, being able to keep the fluid spray density within a desired specification is desired. Collectively, FIGS. 5, 6 and 7 show that pressure and temperature of the supplied fluid material can be adjusted to maintain a desired density, where FIG. 5 shows that adjusting both pressure and temperature may be desired in order to help ensure that the supplied fluid material remains in a desired phase configuration, e.g., liquid, gas, or a combination of liquid and gas.

FIG. 6 shows a sequence of optical images captured of a fluid spray as the flow rate, and hence pressure of argon to the nozzle 110 is decreased from 140 slm to 120 slm and then to 100 slm. The three images of FIG. 6 correspond to the 140, 120, and 100 slm flow rates of argon at constant temperature of 97 K shown in FIG. 5. As the flow rate/ pressure decreases at constant LN2 temperature, the density of the fluid spray 111 also visibly decreases as well. Accordingly, monitoring the fluid spray with optical imaging provides a rapid way to detect when the spray density deviates from a desired specification. The pressure of the argon may be increased or decreased in order to increase or decrease the spray density in response to information obtained in optical images of the fluid spray. FIG. 6 further shows how changes in the flow rate cause corresponding changes to the fluid spray that are visible to the unaided human eye.

FIG. 7 shows how temperature adjustments may be made in order to maintain the density of the fluid spray 111 in response to pressure changes of the argon supplied to chamber 110 as viewed by the unaided human eye. The three images of FIG. 7 correspond to the 160, 170 and 180 slm flow rates in FIG. 2. As the flow rate and hence argon pressure increases, the expectation from FIG. 6 would be that the fluid spray density would increase as well, potentially causing the spray 111 to move out of specification. However, by increasing the temperature of the supplied argon (which is accomplished by increasing the LN2 temperature), the density of the fluid spray 111 is maintained. Even though the argon pressure changes significantly in the sequence of images shown in FIG. 7, note how adjusting the temperature of the supplied argon compensates to maintain the spray density in a uniform manner as observed by the unaided human eye.

This shows that temperature of the supplied fluid material can be adjusted in real time in response to image information in feedback control system. In some embodiments, therefore, the process monitoring system 105 includes a controller 112 configured to adjust at least one input parameter to the vacuum process chamber 104, the substrate stage 122, or the cryogenic fluid supply 103 in response to the fluid spray data. The process monitoring system 105 can include a data library for storing aerosol or other fluid spray data. The data library can include different kinds of aerosol or other fluid spray data, including measured aerosol data, simulated aerosol data, empirical aerosol data, extrapolated aerosol data, or interpolated aerosol data, or combinations of two or more thereof. The controller 112 can be configured to adjust at least one input parameter to the vacuum process chamber 104, the substrate stage 122, or the cryogenic fluid supply 106 in response to the aerosol or other fluid spray data. Fluid spray data may be augmented in the sense that two or more kinds of data are used to determine adjustment(s) to parameters that help to control the fluid spray 111.

Figure 8:
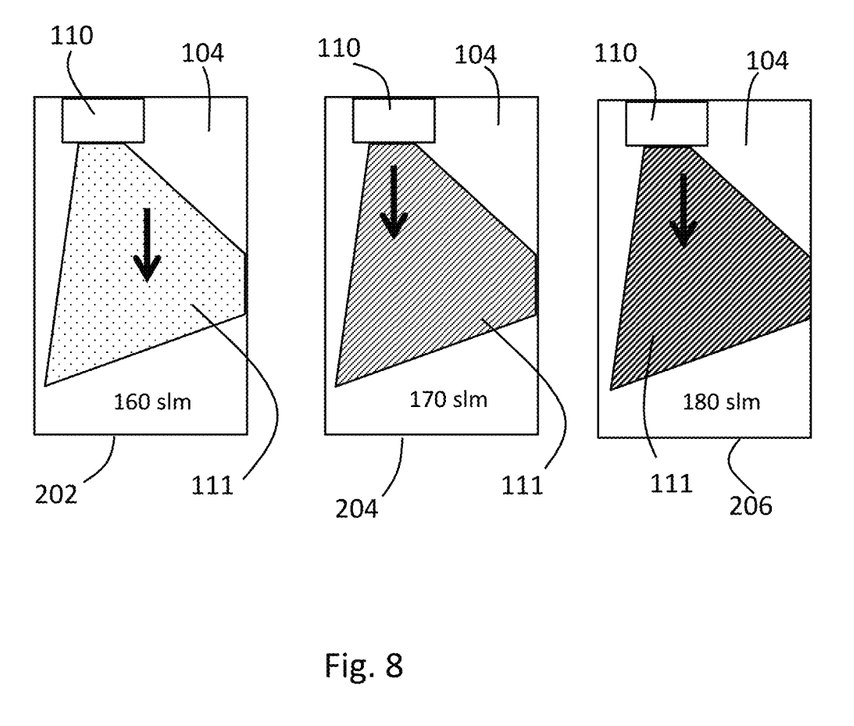
FIG. 8 schematically shows how imaging techniques can be used to show differences among the fluid sprays of FIG. 7 even though such changes were not visible to the unaided human eye.

FIG. 8 schematically shows how differences among the fluid sprays of FIG. 7 can be observed when imaging techniques are applied to the observed fluid sprays 111. In box 202, fluid spray 111 is injected from nozzle 110 into chamber 104 at 160 slm. Although the unaided human eye sees this fluid spray 111 as the same as the fluid sprays 111 in boxes 204 and 206, imaging analysis shows that the fluid spray 111 of box 202 is less dense than the other fluid sprays 111 in boxes 204 and 206. Box 204 shows that the fluid spray 111 sprayed at a higher flow rate of 170 slm is denser than the fluid spray 111 of box 202. Box 206 shows that the fluid spray sprayed at the higher flow rate of 180 slm is even denser than the fluid spray 111 in box 204. FIG. 8 shows that image analysis provide a sensitivity to spray changes that are not as readily observed with the unaided human eye.

Figure 9:
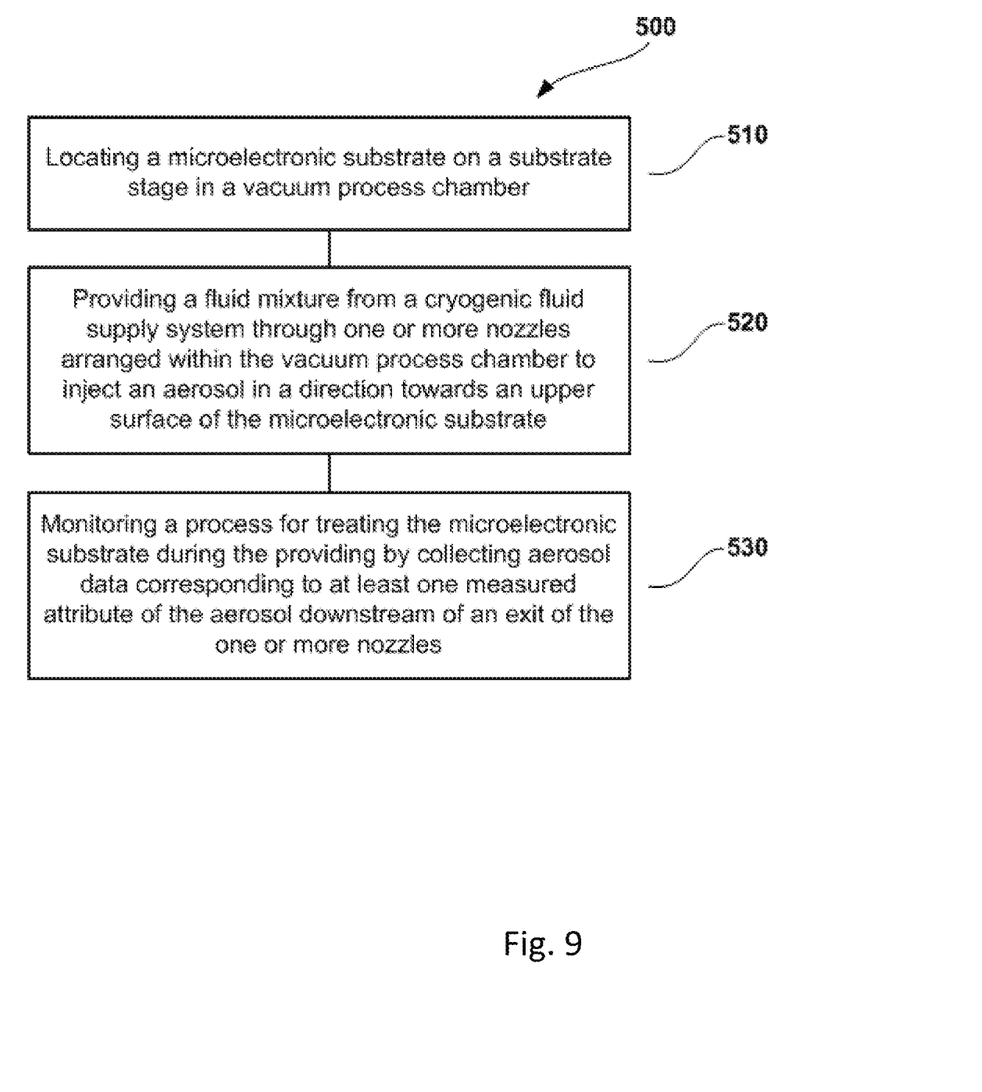
FIG. 9 provides a flow chart illustrating a method of treating a substrate according to an embodiment.

FIG. 9 provides a flow chart illustrating a method 500 of treating a substrate according to an embodiment. The method 500 includes: locating a microelectronic substrate on a substrate stage in a vacuum process chamber in 510; providing a fluid mixture from a cryogenic fluid supply system through one or more nozzles arranged within the vacuum process chamber to inject an aerosol in a direction towards an upper surface of the microelectronic substrate in 520; and monitoring a process for treating the microelectronic substrate during the providing by collecting aerosol data corresponding to at least one measured attribute of the aerosol downstream of an exit of the one or more nozzles in 530. Additionally, the method includes adjusting at least one input parameter to the vacuum process chamber, the substrate stage, or the cryogenic fluid supply in response to the aerosol data.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A system for treating a substrate, comprising:
   (a) a vacuum process chamber;
   (b) a substrate stage for supporting a microelectronic substrate within the vacuum process chamber;
   (c) a cryogenic fluid supply system that can provide a pressurized and cooled fluid or fluid mixture through one or more nozzles arranged within the vacuum process chamber to inject a fluid spray in a direction towards an upper surface of the microelectronic substrate; and
   (d) a process monitoring system coupled to the vacuum process chamber, and arranged to collect fluid spray data corresponding to at least one measured attribute of the injected fluid spray downstream of an exit of the one or more nozzles, wherein the fluid spray data comprises optical information of the fluid spray, and wherein the at least one measured attribute of the fluid spray includes a spray density attribute, and wherein the process monitoring system is configured to adjust temperature and pressure of the pressurized and cooled fluid provided to the one or more nozzles in order to control the spray density attribute and to control the phase of the pressurized and cooled fluid or fluid mixture supplied to the one or more nozzles.

2. The system of claim 1, wherein the process monitoring system is configured to capture at least one optical image of the fluid spray, and to use the at least one optical image to measure the spray density attribute.

3. The system of claim 2, wherein the optical image includes a shadowgraph or schlieren photograph of the fluid spray.

4. The system of claim 2, wherein the process monitoring system is configured to capture a temporal sequence of optical images of the fluid spray, and to use the temporal sequence of optical images to measure a temporal variation of the spray density attribute.

5. The system of claim 1, wherein the process monitoring system includes a light source arranged to illuminate the fluid spray, and an optical detector arranged to capture at least one image of the illuminated fluid spray.

6. The system of claim 5, wherein the light source includes a white light source.

7. The system of claim 5, wherein the optical detector includes a charge-coupled device (CCD) camera, or a charge-injection device (CID) camera.

8. The system of claim 1, wherein the process monitoring system further includes a temperature sensor arranged to measure a fluid spray temperature.

9. The system of claim 1, wherein the process monitoring system further includes a pressure sensor arranged to measure a fluid spray pressure.

10. The system of claim 1, wherein the process monitoring system includes a controller configured to adjust at least one input parameter to the vacuum process chamber, the substrate stage, or the cryogenic fluid supply in response to the fluid spray data.

11. The system of claim 10, wherein the process monitoring system includes a data library for storing the fluid spray data.

12. The system of claim 11, wherein the data library includes different kinds of fluid spray data, including measured fluid spray data, simulated fluid spray data, empirical fluid spray data, extrapolated fluid spray data, augmented fluid spray data, or interpolated fluid spray data, or combinations of two or more thereof.

13. The system of claim 12, wherein the controller is configured to adjust at least one input parameter to the vacuum process chamber, the substrate stage, or the cryogenic fluid supply in response to augmented fluid spray data, the augmented fluid spray data including fluid spray data of one kind augmented by fluid spray data of another kind.

14. The system of claim 1, wherein the cryogenic fluid supply system is configured to supply a fluid or fluid mixture to the one or more nozzles at a temperature less than 273 K.

15. The system of claim 14, wherein the temperature is greater than or equal to 70 K and less than or equal to 120 K.

16. The system of claim 1, wherein the vacuum process chamber includes a pressure control system to maintain a chamber pressure of 35 Torr or less during processing.

17. The system of claim 16, wherein the chamber pressure is maintained at 10 Torr or less during processing.

18. The system of claim 1, wherein the cryogenic fluid supply system is configured to supply a fluid or fluid mixture to the one or more nozzles containing nitrogen, or a noble gas element, or a combination thereof.

19. The system of claim 1, wherein the optical information includes video information of the fluid spray.

* * * * *